United States Patent
Ng

(10) Patent No.: US 11,661,334 B2
(45) Date of Patent: May 30, 2023

(54) OVERLOAD RECOVERY OPTIMIZATION IN MICROELECTROMECHANICAL SYSTEM APPLICATION SPECIFIC INTEGRATED CIRCUIT

(71) Applicant: Apple Inc., Cupertino, CA (US)

(72) Inventor: Eddie L. Ng, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/644,511

(22) Filed: Dec. 15, 2021

(65) Prior Publication Data

US 2022/0177297 A1 Jun. 9, 2022

Related U.S. Application Data

(63) Continuation of application No. 16/426,615, filed on May 30, 2019, now Pat. No. 11,235,970.

(51) Int. Cl.
*H04R 19/00* (2006.01)
*B81B 7/00* (2006.01)
*H04R 19/04* (2006.01)

(52) U.S. Cl.
CPC ............. *B81B 7/008* (2013.01); *H04R 19/04* (2013.01); *B81B 2201/02* (2013.01); *B81B 2201/0257* (2013.01); *B81B 2201/0285* (2013.01); *H04R 2201/003* (2013.01)

(58) Field of Classification Search
CPC ................ B81B 7/008; B81B 2201/02; B81B 2201/0257; B81B 2201/0285; H04R 19/04; H04R 2201/003; H04R 17/02; H04R 19/005; H04R 2430/01; H04R 3/00
See application file for complete search history.

(56) References Cited

U.S. PATENT DOCUMENTS

| 5,483,261 A | 1/1996 | Yasutake |
| 5,488,204 A | 1/1996 | Mead et al. |
| 5,825,352 A | 10/1998 | Bisset et al. |

(Continued)

FOREIGN PATENT DOCUMENTS

| JP | 2000163031 | 6/2000 |
| JP | 2002342033 | 11/2002 |
| WO | W/02018106514 | 6/2018 |

OTHER PUBLICATIONS

Lee, S.K. et al. (Apr. 1985). "A Multi-Touch Three Dimensional Touch-Sensitive Tablet," Proceedings of CHI: ACM conference on Human Factors in Computing Systems, pp. 21-25.

(Continued)

*Primary Examiner* — Matthew A Eason

(57) ABSTRACT

Disclosed herein is a MEMS ASIC. In some examples, the MEMS ASIC can include a MEMS, an analog front end (AFE) amplifier, an analog-to-digital converter (ADC), an overload detector, and a high-ohmic (HO) block. The HO block and the MEMS can form a high-pass filter (HPF). The impedance of the HO block can be related to the DC operating level of the AFE amplifier and the cutoff frequency of the HPF. In some examples, an overload event can occur, and the overload detector can be configured to adjust the impedance of the HO block to reduce the settling time of the MEMS ASIC. Methods of using the MEMS ASIC to reduce the settling time of the MEMS ASIC due to an overload event are disclosed herein.

20 Claims, 7 Drawing Sheets

(56) References Cited

U.S. PATENT DOCUMENTS

| | | |
|---|---|---|
| 5,835,079 A | 11/1998 | Shieh |
| 5,880,411 A | 3/1999 | Gillespie et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 7,015,894 B2 | 3/2006 | Morohoshi |
| 7,184,064 B2 | 2/2007 | Zimmerman et al. |
| 7,663,607 B2 | 2/2010 | Hotelling et al. |
| 8,479,122 B2 | 7/2013 | Hotelling et al. |
| 9,800,217 B1 | 10/2017 | Gandolfi |
| 2006/0197753 A1 | 9/2006 | Hotelling |
| 2009/0121778 A1* | 5/2009 | Ceballos ............... H04R 3/007 327/530 |
| 2010/0013501 A1* | 1/2010 | Van Den Boom ..... H04R 3/007 324/679 |
| 2016/0133271 A1 | 5/2016 | Kuntzman |
| 2018/0167730 A1 | 6/2018 | Parker |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

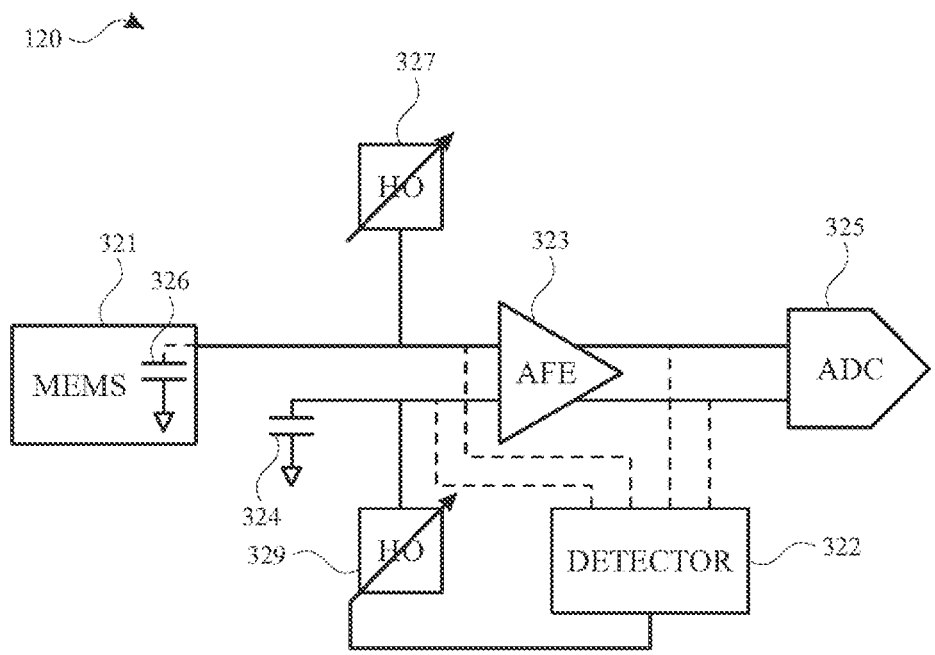
FIG. 3C
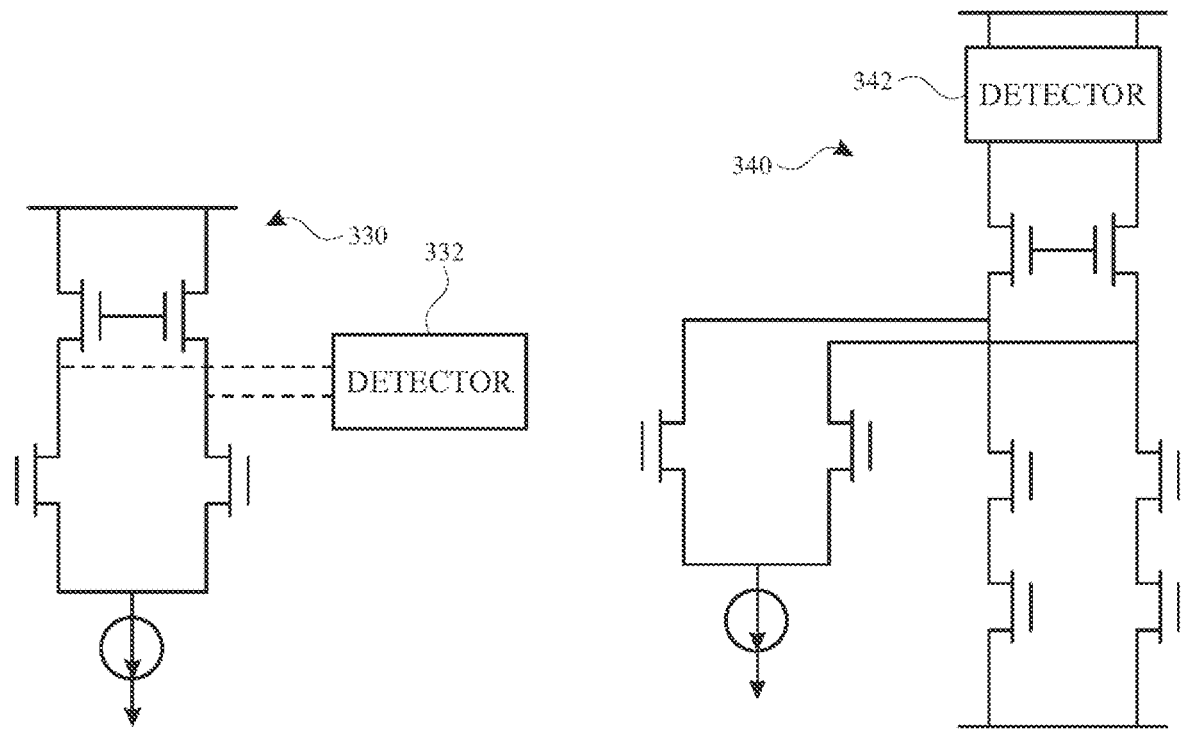
FIG. 3D
FIG. 3E

OVERLOAD RECOVERY OPTIMIZATION IN MICROELECTROMECHANICAL SYSTEM APPLICATION SPECIFIC INTEGRATED CIRCUIT

RELATED APPLICATIONS

The present application is a continuation of U.S. application Ser. No. 16/426,615, filed May 30, 2019, the disclosure of which is incorporated by reference herein in its entirety.

FIELD OF THE DISCLOSURE

This relates generally to a microelectromechanical system (MEMS) sensor integrated or co-packaged with an application specific integrated circuit (ASIC).

BACKGROUND OF THE DISCLOSURE

In modern consumer electronics, portable computing devices such as laptops, notebooks, tablet computers, smart phones, and portable timepieces do not have sufficient space to house relatively large transducers (e.g., microphones, speakers, or the like) and other sensors (e.g., accelerometers, barometric pressure sensors, or the like). Thus, the sizes of transducers and sensors used in such devices are becoming more and more compact and decreasing in size. One type of sensor can be a microelectromechanical system (MEMS) sensor. The MEMS component can be integrated or co-packaged with an application specific integrated circuit (ASIC). The ASIC can have electronic circuits including filters and equalizers to optimize audio signals and minimize unwanted environmental sounds by filtering, switching, and/or amplifying signals from a vibrations sensor and/or a microphone sensor. In some instances, an overload event can occur when the incoming signal is beyond the operating range of the MEMS and ASIC. Before the overload event, the MEMS ASIC may be operating at its targeted DC operating level. The overload event may change the DC operating level of the MEMS ASIC, and the MEMS ASIC may take a time to recover and settle back to its targeted DC operating level. Because the MEMS ASIC may be sampling information while the MEMS ASIC is not at its targeted DC operating level, the sampled information may include unwanted information (e.g., may not be accurate, may be distorted, etc.). For example, as a result of the operating level going out of range, the MEMS ASIC cannot sample information immediately after an overload event. A MEMS ASIC with a reduced amount of time to recover and settle back to its targeted DC operating level after an overload event may be desired.

BRIEF SUMMARY OF THE DISCLOSURE

Disclosed herein is a MEMS ASIC. In some examples, the MEMS ASIC can include a MEMS, an analog front end (AFE) amplifier, an analog-to-digital converter (ADC), an overload detector, and a high-ohmic (HO) block. The HO block and the MEMS can form a high-pass filter (HPF). The impedance of the HO block can be related to the DC operating level of the AFE amplifier and the cutoff frequency of the HPF. In some examples, an overload event can occur, and the overload detector can be configured to adjust the impedance of the HO block to reduce the settling time of the MEMS ASIC. Methods of using the MEMS ASIC to reduce the settling time of the MEMS ASIC due to an overload event are disclosed herein.

BRIEF DESCRIPTION OF THE DRAWINGS

FIG. 3C illustrates a schematic diagram of an exemplary MEMS circuitry including adjustable HO blocks according to examples of the disclosure.

FIG. 3D illustrates a schematic diagram of an exemplary MEMS circuitry including adjustable HO blocks according to examples of the disclosure.

FIG. 3E illustrates a schematic diagram of an exemplary MEMS circuitry including adjustable HO blocks according to examples of the disclosure.

DETAILED DESCRIPTION OF THE INVENTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Disclosed herein is a MEMS ASIC that reduces the recovery time or settling time due to an overload event. In some instances, an overload event can occur when the incoming signal is beyond the operating range of the MEMS and ASIC. Exemplary overload events can include, but are not limited to, a shock event and a clipping event. For example, a rapid change in pressure, a high amount of pressure, a high voltage level, a change due to other external forces, or a combination thereof can cause a high deflection of the MEMS component. The high deflection can lead to an overload event.

In some examples, the MEMS ASIC can be implemented as a part of an electronic device with an acoustic component, an ambient sensing component, or the like. For example, the MEMS component may be a MEMS vibrations sensor that can detect vocal sounds based on contact with a vibrating surface of a user (e.g., portion of the neck near the user's vocal cords). The MEMS vibrations sensor may be used to detect low frequency sounds using mechanical vibrations of the skin near the vocal cord of a user (e.g., the neck). In some examples, the MEMS ASIC may include the MEMS microphone, the MEMS vibrations sensor, or both. In such instances, when vocal sound detection is desired, while a level of unwanted environmental sound is high (e.g., the user is in a subway, at the airport, in traffic, at a rock concert, etc.), the MEMS vibrations sensor can be used instead of, or in addition to, the MEMS microphone to detect the vocal sound using mechanical vibrations. As another example, the MEMS component may be a MEMS microphone that can detect vocal sounds. The MEMS microphone may be configured to sense air pressure changes to detect vocal sounds that are outside of (e.g., higher), or overlapping with, the frequency range detectable by the vibrations sensor. Examples of the disclosure can include any combination of MEMS components, not limited to microphones and vibrations sensors, without departing from the scope of this disclosure.

Figure 1:
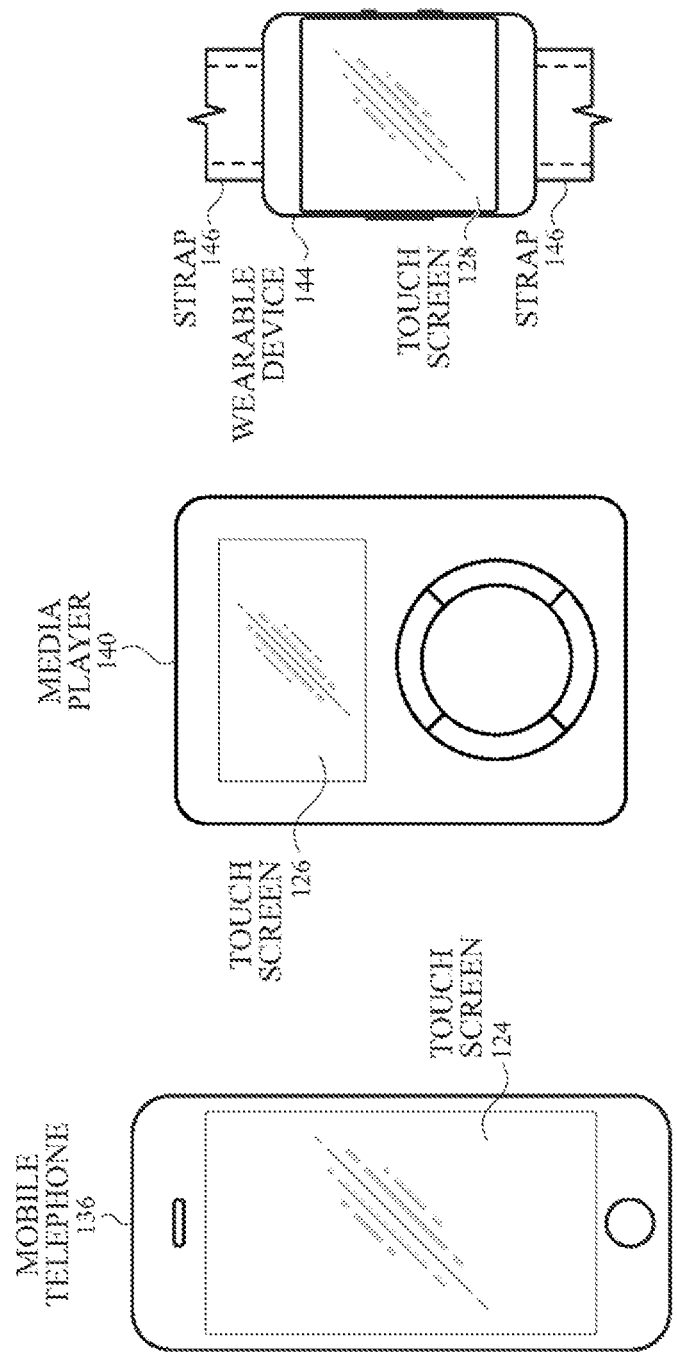
FIGS. 1A-1C illustrate systems in which examples of the disclosure can be implemented.

FIGS. 1A-1C illustrate systems in which examples of the disclosure can be implemented. FIG. 1A illustrates an exemplary mobile telephone 136 that can include a touch screen 124. FIG. 1B illustrates an exemplary media player 140 that can include a touch screen 126. FIG. 1C illustrates an exemplary wearable device 144 that can include a touch screen 128 and can be attached to a user using a strap 146. The systems of FIGS. 1A-1C can utilize the disclosed MEMS ASIC and methods for operation thereof.

Figure 2:
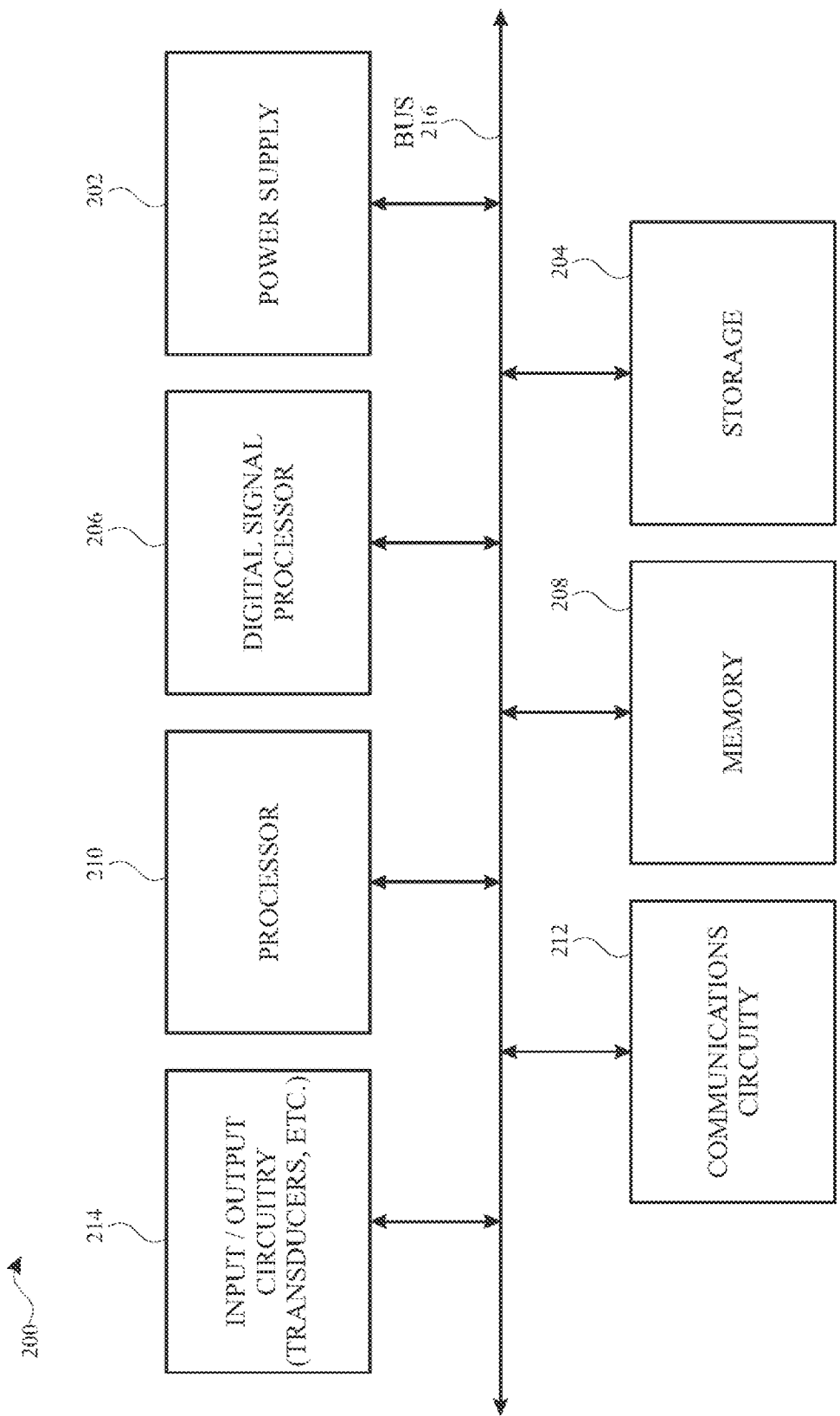
FIG. 2 illustrates an exemplary block diagram of a part of a system in which examples of the disclosure may be implemented.

FIG. 2 illustrates a block diagram of an exemplary electronic device according to examples of the disclosure. Device 200 can include a power supply 202, storage 204, a signal processor 206, memory 208, a processor 210, communication circuitry 212, and input/output circuitry 214. In some examples, the device 200 can include additional components or may omit some of the components shown in FIG. 2. In some instances, the functionality of certain components can be combined or omitted.

Power supply 202 can provide power to the components of the device 200. In some examples, power supply 202 can be coupled to a power grid such as, for example, a wall outlet. In some examples, power supply 202 can include one or more batteries for providing power to an ear cup, headphone, or other type of electronic device associated with the headphone. As another example, power supply 202 can be configured to generate power from a natural source (e.g., solar power using solar cells).

Storage 204 can include, for example, a hard-drive, flash memory, cache, ROM, and/or RAM. Additionally, storage 204 can be local to and/or remote from the device 200 (not shown). For example, storage 204 can include integrated storage medium, removable storage medium, storage space on a remote server, wireless storage medium, or any combination thereof. Furthermore, storage 204 can store data such as system data, user profile data, and any other relevant data.

Signal processor 206 can be a digital signal processor, used for real-time processing of digital signals that are converted from analog signals by, e.g., input/output circuitry 214. After processing the digital signals, the digital signals could then be converted back into analog signals.

Memory 208 can include any form of temporary memory such as RAM, buffers, and/or cache. Memory 208 can also be used for storing data used to operate electronic device applications (e.g., operation system instructions).

In addition to the signal processor 206, the device 200 can include a processor 210. The processor 210 can be capable of interpreting system instructions and processing data. For example, the processor 210 can be capable of executing instructions or programs such as system applications, firmware applications, and/or any other application. Additionally, the processor 210 has the capability to execute instructions in order to communicate with any or all of the components of the device 200. For example, the processor 210 can execute instructions stored in memory 208 to enable or disable active noise control (ANC) (e.g., in an audio system).

Communication circuitry 212 may be any suitable communications circuitry operative to initiate a communications request, connect to a communications network, and/or to transmit communications data to one or more servers or devices within the communications network. For example, communications circuitry 212 may support one or more of Wi-Fi (e.g., a 802.11 protocol), Bluetooth®, high frequency systems, infrared, GSM, GSM plus EDGE, CDMA, or any other communications protocol and/or any combination thereof.

Input/output circuitry 214 can convert (and encode/decode, if necessary) analog signals and other signals (e.g., physical contact inputs, physical movements, analog audio signals, etc.) into digital data. Input/output circuitry 214 can also convert digital data into any other type of signal. The digital data can be provided to and received from processor 210, storage 204, memory 208, signal processor 206, or any other component of the device 200. Input/output circuitry 214 can be used to interface with any suitable input or output devices, such as, for example, MEMS sensors, microphone, speakers, or the like. Furthermore, the device 200 can include specialized custom input circuitry associated with input devices such as, for example, MEMS sensors, one or more proximity sensors, accelerometers, etc. The device 200 can also include specialized output circuitry associated with output devices such as one or more speakers, earphones, etc.

Bus 216 can provide a data transfer path for transferring data to, from, or between the processor 210, storage 204, memory 208, communications circuitry 212, and any other component included in the device 200. Although bus 216 is illustrated as a single component in FIG. 2, one skilled in the art would understand that the device 200 may include one or more components.

Figure 3A:
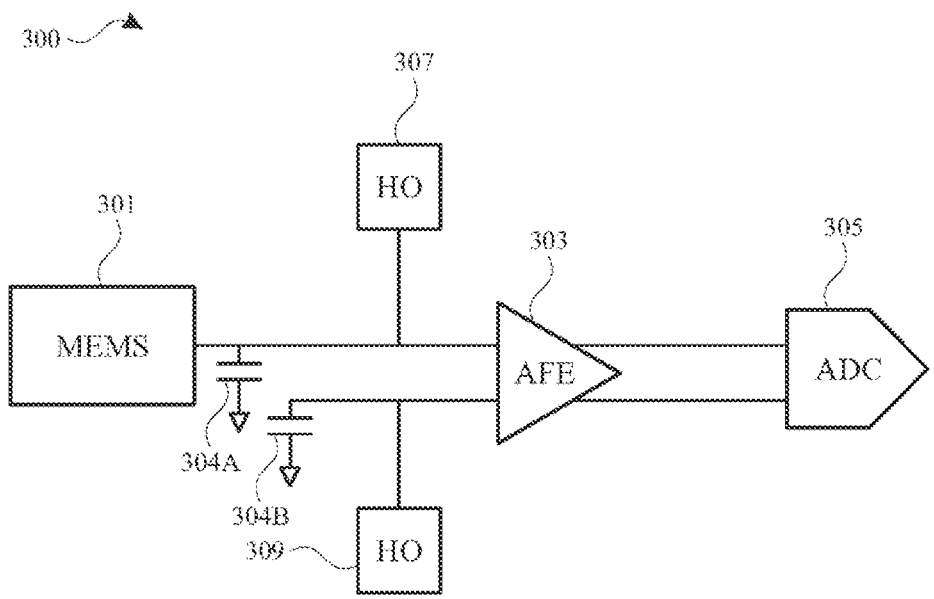
FIG. 3A illustrates a schematic diagram of an exemplary MEMS circuitry according to examples of the disclosure.

In some examples, the input/output circuitry 214 may include the disclosed MEMS ASIC. FIG. 3A illustrates a schematic diagram of an exemplary MEMS circuitry according to examples of the disclosure. MEMS circuitry 300 may include a MEMS component 301, an AFE amplifier 303, and an ADC 305. In some examples, the MEMS circuitry 300 can be a MEMS ASIC. The output of the MEMS component 301 may be coupled to the input of the AFE amplifier 303. Both inputs of the AFE amplifier 303 may capacitively couple to ground, as represented in the figures with capacitors 304A and 304B, or to the MEMS outputs (not shown). One skilled in the art would understand that the capacitors 304A and 304B are representative of an effective capacitance to ground and may not be discrete capacitors. At least one outputs of the AFE amplifier 303 may couple to an input of the ADC 305. The output of the ADC 305 may couple to a circuit (not shown) for processing. Although MEMS component 301 is illustrated as having one output, it is understood that the MEMS component 301 can include differential output (not shown) (e.g., the MEMS component differential outputs couple to the differential inputs of the AFE amplifier) without departing from the scope of the disclosure.

The MEMS circuit 300 may further include a high-ohmic (HO) network configured to set the DC operating level of the AFE amplifier 303. The HO network may include a set of HO blocks 307 and 309. The HO block 307 may couple to at least one input of the AFE amplifier 303. The effective resistance of a HO block may be used to set the bias voltage of the AFE amplifier 303. In some examples, the first HO block 307 may couple to a first input of the AFE amplifier 303, while the second HO block 309 may couple to the second input of the AFE amplifier 303. The HO network and the effective capacitance (e.g., from MEMS component 301) may form a high pass filter (HPF). In this manner, the HO network may be used to set the bandwidth of the HPF. According to some examples of this disclosure, the cutoff frequency (e.g., −3 dB frequency) of the HPF may be selected from a range of few Hz-20 kHz. To achieve this cutoff frequency, for example, an effective capacitance may be in a range of tens of pF, and an effective resistance of a HO block may be in a range of hundreds of megaohms to few gigaohms.

In some applications, the HPF may have a lower cutoff frequency, which can result in longer time constants and a longer settling time. An exemplary application can include passing frequencies of interest from the MEMS component 301 and filtering out frequencies that are not of interest. In these instances, during an overload event, the MEMS may take a longer amount of time to recover and settle because of the longer time constant. The longer recovery time and the longer settling time may mean the time for the overload signal to decay can take longer. Due to the longer recovery time and the settling time, output signals from the MEMS circuitry may include inaccurate information if sampled before the MEMS ASIC has recovered and settled from the overload event. In some examples, a MEMS ASIC that includes a HPF capable of operating at a desired cutoff frequency may be desired. In some examples, a MEMS ASIC with a reduced amount of time to recover and settle back to its targeted DC operating level after an overload event may be desired.

One way to reduce the effects of an overload event can be to clamp the inputs of the AFE amplifier 303. In some instances, clamping the inputs may add noise, leakage, and distortion to the MEMS circuitry 300 and may interfere with startup operation. In some instances, such clamping method may not provide the benefits of reducing recovery time due to this interference.

Examples of the disclosure can include a MEMS circuitry including adjustable HO blocks. FIG. 3A illustrates a schematic diagram of an exemplary MEMS circuitry including adjustable HO blocks according to examples of the disclosure. MEMS circuitry 310 can include a MEMS component 311, an AFE amplifier 313, an ADC 315, a HO network, and an overload detector 312. In some examples, the MEMS circuitry 310 can be a MEMS ASIC. In some examples, the MEMS component 311 can be a MEMS structure. The HO network can include a set of adjustable HO blocks 317 and 318. Both inputs of the AFE amplifier 313 may capacitively couple to ground, as represented in the figure with capacitors 314A and 314B. One skilled in the art would understand that the capacitors 314A and 314B are representative of an effective capacitance to ground and may not be discrete capacitors. An output of the MEMS component 311 may couple to an input of the AFE amplifier 313. At least one output of the AFE amplifier 313 may couple to the ADC 315. The output of the ADC 315 may couple to circuitry (not shown) for processing. The HO network may couple to the inputs of the AFE amplifier 313, as described with respect to FIG. 3A. For example, a first adjustable HO block 317 may couple to a first input of the AFE amplifier 313, and a second adjustable HO block 319 may couple to the second input of the AFE amplifier 313. As discussed above, the HO network can be configured to set the DC operating level of the AFE amplifier 313 and/or the bandwidth of the HPF. Although MEMS component 311 is illustrated as having one output, it is understood that the MEMS component 311 can include differential output (not shown) (e.g., the MEMS component differential outputs couple to the differential inputs of the AFE amplifier) without departing from the scope of the disclosure.

Figure 3B:
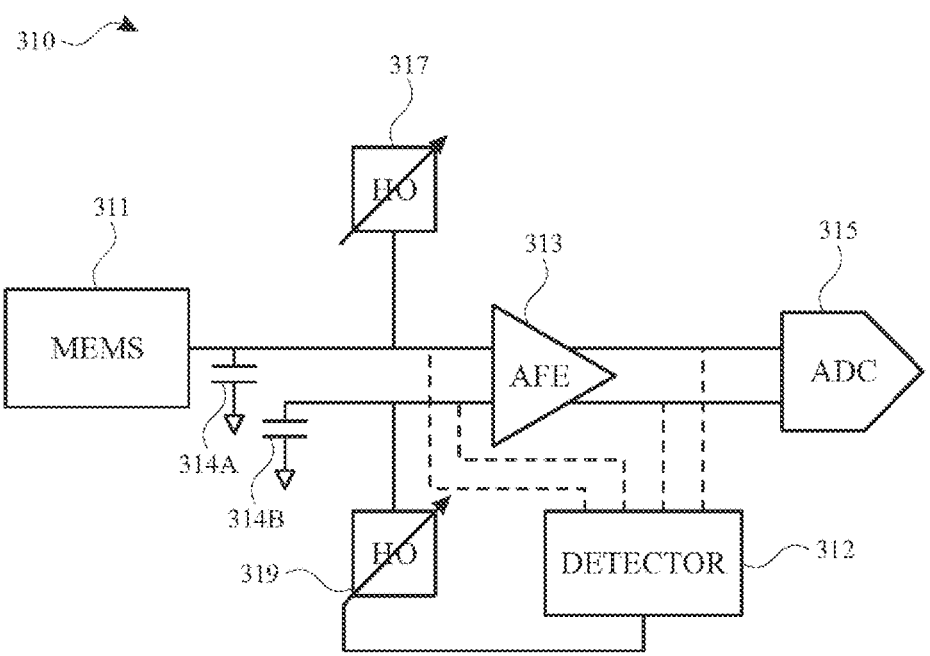
FIG. 3B illustrates a schematic diagram of an exemplary MEMS circuitry including adjustable HO blocks according to examples of the disclosure.

The overload detector 312 can be configured to sense an overload event. The overload detector 312 may couple to components of the MEMS circuitry 310 at one or more locations or to a MEMS structure. For example, the detector 312 may couple to the AFE amplifier 313's inputs, the AFE amplifier 313's outputs, or both and can be configured to sense the corresponding signals. For example, the overload detector 312 can sense an overload event associated with MEMS component 311 by being coupled to one or more inputs of the AFE amplifier 313. As shown with the dashed lines in FIG. 3B, the overload detector 312 may be coupled to both AFE amplifier inputs and both AFE amplifier outputs. In some examples, the detector 312 may be coupled (not shown) to an output of the ADC 315. In some examples, the detector 312 may be coupled (not shown) to components of the MEMS circuitry 310 that may be sensitive to overload events, may be critical to system performance (e.g., to detect an overload associated with rapid, undesired changes to the MEMS component 311), or the like. In some examples, the detector 312 can sense the internal circuit operating condition, such as internal voltage swing, bias voltage, or current level inside AFE amplifier 313. For example, the detector 312 may sense that the AFE amplifier 313 has saturated during an overload event.

In some examples, one or more outputs of the detector 312 may be coupled to the HO network (e.g., adjustable HO blocks 317 and 319). The detector 312 can be used to individually adjust the resistance of a given HO block. Although the figure illustrates the detector 312 as coupled to the adjustable HO block 319 only, one skilled in the art would understand that, for the sake of clarity, the detector 312 may additionally, or alternatively, be coupled to the adjustable HO block 317. In some examples, the detector 312 may output one or more signals (e.g., voltage signals) to control an effective resistance of an adjustable HO block.

In some examples, the outputs of detector 312 can operate independently. For example, if an overload event is detected at a first location of the circuitry, but the overload is not detected at a second location of the circuitry, the detector 312 can adjust the signals to the HO block associated with the first location, but may not adjust the signals to the HO block associated with the second location.

In some examples, the detector 312 can be implemented with digital or analog circuitry. The detector 312 may be configured to produce zero or negligible noise or distortion.

In some examples, the detector 312 may have negligible loading effects on the MEMS circuitry 310. Additional power consumption by the detector 312 may be negligible. For example, in a digital implementation (e.g., the detector includes digital logic, digital comparators, etc.), the switching power consumed by the detector may be low. For an analog implementation, the analog detector may be biased when an overload event is detected. After determining that an overload event is occurring or about to occur (using the methods described herein), the overload detector 312 can adjust the signals to one or more adjustable HO blocks of the HO network to reduce the overload recovery time.

Examples of the disclosure can include the overload detector 312 being coupled to other components of the MEMS circuitry 310 (e.g., AFE amplifier 313) to determine the state of an overload event. Exemplary other components can include nodes internal to the AFE. Exemplary states include, but is not limited to, an overload event that is occurring or about to occur, an overload event that has ended, an overload event that has not happened, and an overload event that has not ended. Examples of the disclosure can further include using criterion other than thresholds. Exemplary criterion can include, but is not limited to, sense an input signal swing and sensing an output signal swing. Exemplary thresholds can also be based on other types of properties such as an input differential pair's operating current, a folded cascode current, a mirror stage current, and an output state pull-push current/voltage of the AFE.

For example, as illustrated in FIG. 3D, the overload detector 332 can be coupled to differential outputs of differential amplifier 330 and sense the differential pair's operating current. In some examples, the AFE amplifier can be differential amplifier 330. As another example, as illustrated in FIG. 3E, the overload detector 342 can be coupled between a supply voltage and a folded cascode amplifier 340 and sense the folded cascode current or supply currents. In some examples, the AFE amplifier can be folded cascode amplifier 340.

Although the AFE amplifier 313 is illustrated as having differential inputs and differential outputs, one skilled in the art would appreciate that the AFE amplifier 313 can have a single-ended input or a single-ended output. In some examples, the single-ended input of the AFE amplifier 313 may couple to the MEMS component 311. A HO block can couple to the input of the AFE amplifier 313, and the overload detector 312 can couple to the single-ended input or the single-ended output of the AFE amplifier 313. In some examples, the ADC 315 may be configured to receive a single-ended input from the AFE amplifier 313.

Figure 4A:
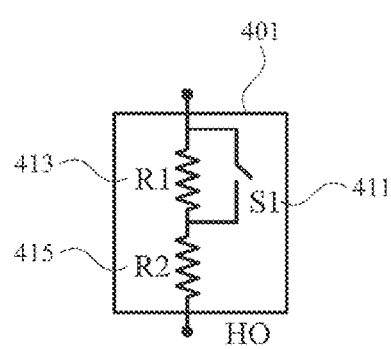
FIG. 4A illustrates an exemplary adjustable HO block including a set of resistors according to examples of the disclosure.

The HO network may include a set of adjustable HO blocks, and each adjustable block may include a combination of switches, resistors, and voltage controlled resistor/current sources (e.g., MOSFETs). FIG. 4A illustrates an exemplary adjustable HO block including a set of resistors according to examples of the disclosure.

The adjustable HO block 401 can include at least two resistors 413 and 415 in series, and a switch 411 in parallel with at least one of the resistors (e.g., resistor 413). When the switch 411 is in an open state, current can run through the resistors 413 and 415. When the switch 411 is in a closed state, current can flow primarily through the switch 411 and resistor 415. In some examples, the overload detector (e.g., detector 312 illustrated in FIG. 3B) may couple to the switch 411 of the adjustable HO block to control the state (e.g., on or off) of the switch 411. In this manner, the overload detector may control the state of the switch to adjust the HO block 401 to reduce the recovery time. For example, the overload detector may reduce the resistance of the adjustable HO block 401 to reduce the recovery time by closing the switch.

In some examples, the effective resistance (e.g., R1+R2) of adjustable HO block 401, when the switch is off, can be related to (e.g., R1+R2 is the effective resistance in the term $1/(2\pi RC)$) the cutoff frequency of the HPF and the DC operating level of the AFE amplifier. The HPF is formed by HO block and the capacitance at an output node (e.g., the MEMS effective capacitance) of the HO block. In some examples, the effective resistance of the HO block 401 when the switch is on (e.g., R2) can be related an attenuation factor (e.g., N=1+R1/R2). The attenuation factor can be indicative of a reduction in the settling time.

Figure 4B:
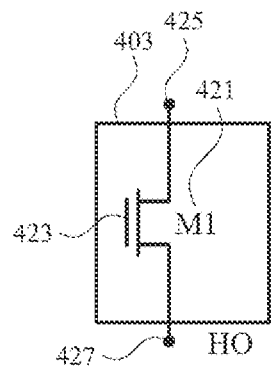
FIG. 4B illustrates an exemplary adjustable HO block including a MOSFET according to examples of the disclosure.

In some examples, the adjustable HO block can include a MOSFET, as shown in FIG. 4B, according to examples of the disclosure. The adjustable HO block 403 can include a MOSFET 421. When sufficient voltage (e.g., $V_{GS}>V_{on}$ of the MOSFET) is applied to the gate terminal 423, additional current can flow between the source 425 and the drain 427 of the MOSFET 421. In some examples, the overload detector (e.g., detector 312 illustrated in FIG. 3B) may be coupled to the gate terminal 423 to control the MOSFET 421. In this manner, the overload detector may control the MOSFET 421 to adjust the HO block 403 and reduce the recovery time. For example, the overload detector may reduce the resistance of the adjustable HO block 403 to reduce the recovery time by turning on the MOSFET 421.

In some examples, the effective resistance of adjustable HO block 403, when the MOSFET 421 is in a higher impedance state (e.g., the transistor is off, $R=R_{off}$), can be related to (e.g., $R_{off}$ is the effective resistance in the term $1/(2\pi RC)$) the cutoff frequency of the HPF and the DC operating level of the AFE amplifier. The HPF is formed by HO and the capacitance at an output node (e.g., the MEMS effective capacitance) of the HO block. In some examples, the effective resistance of the adjustable HO block 403 when the MOSFET 421 is in a lower impedance state (e.g., the transistor is on, $R=R_{on}$) can be related to (e.g., equal to) an attenuation factor (e.g., $N=R_{off}/R_{on}$). The attenuation factor can be indicative of a reduction in overload event settling time constant.

Figure 4C:
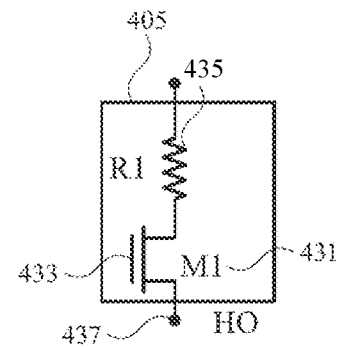
FIG. 4C illustrates an exemplary adjustable HO block including a resistor and MOSFET according to examples of the disclosure.

FIG. 4C illustrates another adjustable HO block, which can include a resistor and MOSFET according to examples of the disclosure. The adjustable HO block 405 may include a resistor 435 in series with a MOSFET 431. When sufficient voltage (e.g., $V_{GS}>V_{on}$ the MOSFET) is applied to the gate terminal 433 of the MOSFET 431, additional current can flow from the resistor 435 to the drain 437 of the MOSFET 431. In some examples, the overload detector (e.g., detector 312 illustrated in FIG. 3B) may couple to the gate terminal 433 to control the MOSFET 431. In this manner, the overload detector may control the MOSFET 431 to adjust the HO block 405 and reduce the recovery time. For example, the overload detector may reduce the resistance of the adjustable HO block 405 to reduce the recovery time by turning on the MOSFET 431.

In some examples, the effective resistance (e.g., $R1+R_{off}$) of adjustable HO block 405, when the MOSFET 431 is in a higher impedance state (e.g., the transistor is off), can be related to (e.g., $R1+R_{off}$ is the effective resistance in the term $1/(2\pi RC)$) the cutoff frequency of the HPF and the DC operating level of the AFE amplifier. The HPF is formed by HO and the capacitance at an output node (e.g., the MEMS effective capacitance) of the HO block. In some examples, the effective resistance (e.g., $R1+R_{on}$) of the adjustable HO block 405 when the MOSFET 431 is in a lower impedance state (e.g., the transistor is on) can be related to (e.g., equal to) an attenuation factor (e.g., $N=(R1+R_{off})/(R1+R_{on})$), which can be indicative of a reduction in settling time.

Figure 4D:
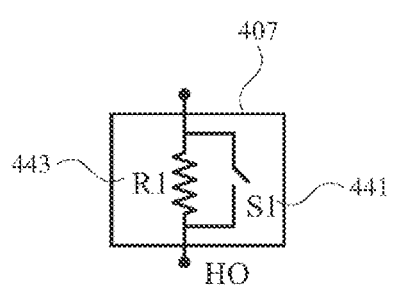
FIG. 4D illustrates an exemplary adjustable block including a switch and a resistor in parallel according to examples of the disclosure.
Figure 4E:
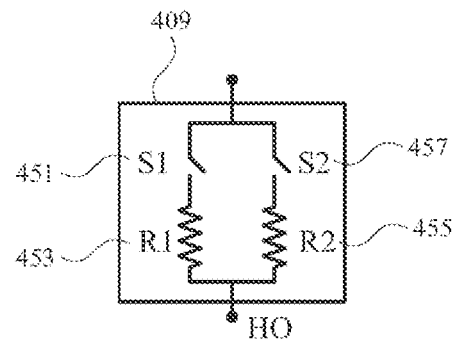
FIG. 4E illustrates an exemplary adjustable block including a set of resistors in parallel according to examples of the disclosure.

Although the adjustable HO blocks are described with specific elements (e.g., switches, resistors, and MOSFETs), one skilled in the art would understand that other combinations of elements having effective resistances (e.g., an element having a resistance across two terminals of the element) can be included in an adjustable HO block without departing from the scope of the disclosure. For example, the HO block may include a switch (e.g., switch 441) and a resistor (e.g., resistor 443) in parallel, as illustrated in FIG. 4D, where a lower resistance can be achieved by closing the switch. As another example, the HO block may include a set of resistors (e.g., resistors 453, 455) in parallel, as illustrated in FIG. 4E; these resistors may be selectively coupled (e.g., with switches 451, 457) to achieve a desired effective resistance. As yet another example, the illustrated HO blocks may be coupled in parallel. For example, adjustable HO blocks 401 and 403 can be coupled in parallel. The lowest effective resistance of the parallel combination can be $(R2^{-1}+R_{on}^{-1})^{-1}$, when the switch and the MOSFET are both on. The highest effective resistance of the parallel combination can be $((R1+R2)^{-1}+R_{off}^{-1})^{-1}$, when the switch and the MOSFET are both off.

As described above, the HO blocks can be adjusted using a set of resistors. For example, a first resistor can be used to maintain the DC operating level and high-pass filtering at a desired cutoff frequency, and a second resistor can be used to reduce overload settling time. In some examples, the first resistor can have a higher first resistance than the second resistance of the second resistor. Examples of the disclosure can include other configurations to adjust the resistance by, e.g., adding components in series, in parallel, or both. For example, an additional resistor/switch pair may be added in series with the adjustable HO block 401 to achieve a set of adjustable resistances (e.g., R2, R1+R2, R1+R2+R3).

Referring back to FIG. 3C, a MEMS circuitry 320 may include a MEMS component 321, an AFE amplifier 323, an ADC 325, a HO network, and an overload detector 322. In some examples, the MEMS circuitry 320 can be a MEMS ASIC. The HO network can include a set of adjustable HO blocks 327 and 329. The MEMS 321 may be modeled as a capacitor 326 having an effective MEMS capacitance, as shown in the figure. In some examples, the capacitor may be representative of a sensor (e.g., microphone, audio sensor, vibrations sensor) capacitance of the MEMS 321. Although one capacitor is illustrated, one skilled in the art would understand that the MEMS 321 may include more than one sensor and more than one representative capacitances associated with the more than one sensor. For example, the MEMS ASIC 320 can be one of a set of channels. An output of the MEMS 321 may couple to an input of the AFE amplifier 323. The other input of the AFE amplifier 323 may capacitively couple to ground, as represented in the figure with capacitor 324. One skilled in the art would understand that the capacitors 324 and 326 are representative of an effective capacitance to ground and may not be discrete capacitors. At least one output of the AFE amplifier 323 may couple to the ADC 325. The output of the ADC 325 may couple to a circuit (not shown) for processing. The HO network and the detector may be configured, as described with respect to FIGS. 3A and 3B, to set a DC operating level and HPF cutoff frequency and reduce overload recovery time. Although MEMS component 321 is illustrated as having one output and one effective capacitance, it is understood that the MEMS component 301 can include differential output and an effective capacitance for each differential output (not shown) (e.g., the MEMS component differential outputs couple to the differential inputs of the AFE amplifier) without departing from the scope of the disclosure.

Figure 5:
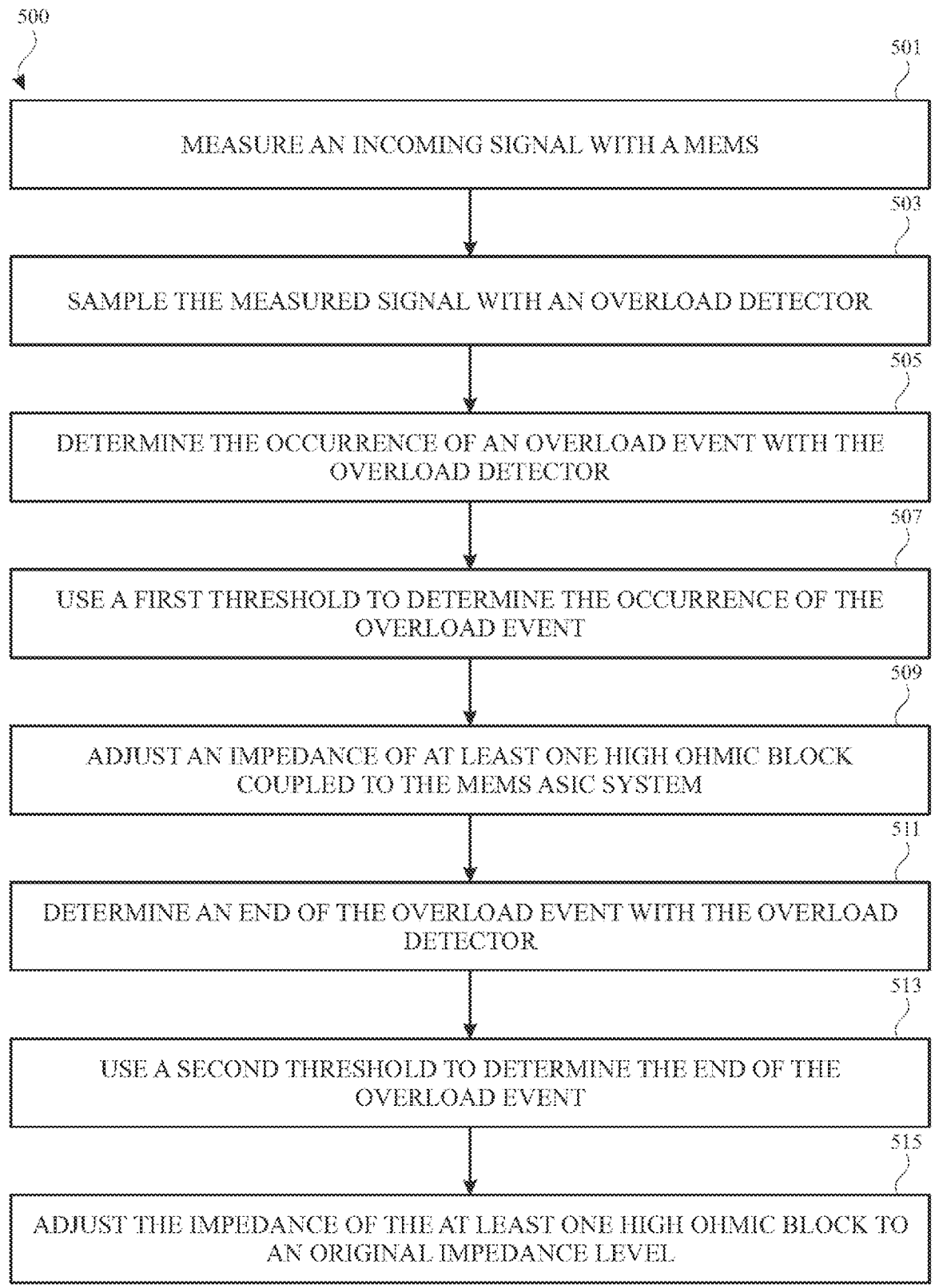
FIG. 5 illustrates a process flow of an exemplary overload reduction operation using the disclosed MEMS circuitry according to examples of the disclosure.

FIG. 5 illustrates a process flow of an exemplary overload reduction operation using the disclosed MEMS circuitry according to examples of the disclosure. Process 500 can begin with the MEMS component (e.g., MEMS component 311 illustrated in FIG. 3B) configured to measure an incoming signal (step 501). For example, if the MEMS component is a MEMS microphone, the measured signal may correspond to detected pressure changes in the air. As another example, the MEMS component may be a vibrations sensor, and the measured signal can be associated with detected vibration. The signal may be sent to the AFE amplifier for amplification before being sent to the ADC. The ADC may send the signal for further processing. For example, the converted signal may be sent to a processor coupled to the MEMS circuitry. In some examples, at step 501, the adjustable HO blocks of the HO network can be at a first resistance that sets the circuit's DC operating level and/or HPF cutoff frequency.

In some examples, an overload detector (e.g., detector 312 illustrated in FIG. 3B) may sense a signal at one or more locations (step 503). The overload detector may couple to an input of the AFE amplifier (e.g., AFE amplifier 313 illustrated in FIG. 3B) (e.g., to sense the measured signal), an output of the AFE, an output of the ADC (e.g., ADC 315 illustrated in FIG. 3B), or any other locations of the circuitry.

In some examples, the overload detector (and/or logic) can be configured to determine or predict the occurrence of an overload event. If an overload event occurs while the MEMS component is sampling information, the sampled information may not be accurate due to, e.g., interference from the overload event. For example, the MEMS component may experience high deflection due to a high pressure, a high electric voltage, or affects from other external forces. The overload detector (and/or logic) can determine that an overload event is occurring or is about to occur (step 505).

In some examples, the detector (e.g., detector 312 illustrated in FIG. 3B) (and/or logic coupled to the detector) can use one or more first thresholds to determine whether an overload event is occurring or is about to occur (step 507). The detector can determine that an overload event is occurring or about to occur based on a comparison of the properties (e.g., values, rate of change, etc.) of the signal to the first threshold. For example, the detector and logic can determine that a given signal has one or more properties (e.g., voltage level) above a first threshold. Responsive to determining that the overload event is occurring or is about to occur, the detector can adjust (e.g., lower) an effective resistance of a HO block to reduce the recovery time.

As another example, the detector and logic can determine that a given signal has one or more properties that are below a first threshold. The detector can determine that an overload event is not occurring. Responsive to determining that an overload event is not occurring, the detector may not adjust the effective resistance of a HO block. In some examples, the detector may maintain the DC operating level of the AFE amplifier and/or the cutoff frequency of the HPF.

Responsive to determining that an overload is occurring or is about to occur, the overload detector can adjust the impedance of at least one HO block of the HO network (step 509). For example, at a falling edge of the signals associated with the overload event, the overload detector (and/or logic) may activate a low impedance path by decreasing the resistance of the HO block from a higher resistance to a lower resistance. The change in resistance may results in reducing the recovery time. For example, during an overload event, the detector output can stay at a logic low state (e.g., ground, negative rail voltage) in a digital implementation, or at a low voltage level in an analog implementation. When the falling edge of the overload event is detected, the detector can transition the output to a logic high state (e.g., positive rail voltage) or a high voltage level to modify the impedance of a coupled adjustable HO block. In some examples, the overload detector may adjust more than one HO block of the HO network. In some examples, the particular HO block that is adjusted may depend on the characteristics (e.g., amplitude, location, etc.) of the detected overload event.

The overload detector may determine that the overload event has ended (step 511). In some examples, the detector (or logic coupled to the detector) can use one or more second thresholds to determine whether an overload event has ended or is about to end (step 513). In some instances, the detector can detect that the system has recovered or settled after an overload event. The detector can determine that an overload event has ended or is about to end based on a comparison of the properties (e.g., values, rate of change, etc.) of the signal to the second threshold. For example, the detector and logic can determine that a given signal has one or more properties (e.g., voltage level) above a second threshold. Responsive to determining that the overload event has ended or is about to end, the detector can adjust (e.g., increase) an effective resistance of a HO block to return the AFE amplifier to its targeted DC operating level, to return the HPF to its designed cutoff frequency, or both.

As another example, the detector and logic can determine that a given signal has one or more properties below a second threshold. The detector 312 can determine that an overload event has not ended. Responsive to determining that an overload event has not ended, the detector 312 may not adjust the effective resistance of a HO block.

In some examples, the second threshold may be lower than the first threshold. One skilled in the art would understand that the first threshold(s) and the second threshold(s) may not be limited to an absolute value; one or more thresholds may instead be a range of values. In some examples, the threshold may be indicative of a rate of change of the sensed signal (e.g., a quick rise time indicates that an overload event may be occurring, a reducing fall time indicates that an overload event may be nearing its end, etc.).

The overload detector may adjust the impedance of the HO block to a targeted impedance level (step 515). The targeted impedance level may be the impedance level of the HO block before the overload event occurred.

Figure 6A:
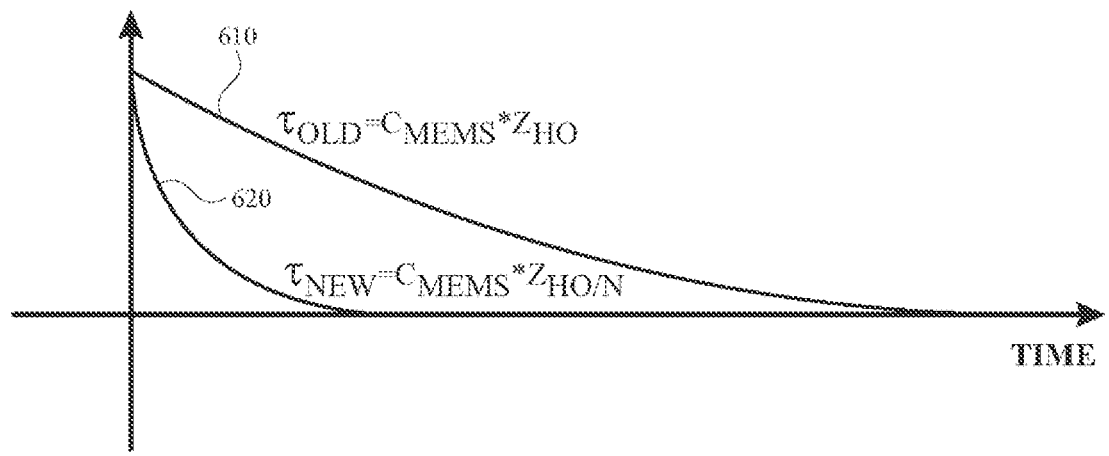
FIG. 6A illustrates a plot of curves having exemplary time constants associated with overload events according to examples of the disclosure

As discussed above, adjusting the impedance of one or more HO blocks may reduce the settling time, which can allow the MEMS to sample data sooner after an overload event and have the sampled information be accurate. FIG. 6 illustrates a plot of curves having exemplary time constants associated with overload events according to examples of the disclosure. The plot shows curve 610 and curve 620. The curve 610 can correspond to the time constant associated an overload event in a MEMS circuitry that does not use an overload detector (e.g., MEMS circuitry 300 illustrated in FIG. 3A). The curve 620 can correspond to the time constant associated with an overload event in a MEMS circuitry that includes and uses an overload detector (e.g., MEMS circuitry 310 illustrated in FIG. 3B).

As illustrated, the curve 610 has a time constant of $\tau_{OLD}=C_{MEMS}*Z_{HO}$, and curve 620 has a time constant of $\tau_{NEW}=C_{MEMS}*(Z_{HO}/N)$. $C_{MEMS}$ represents an effective capacitance (e.g., capacitor 326) of a MEMS component, $Z_{HO}$ represents an effective impedance of a HO block when an overload event is not occurring, and N represents an attenuation factor. Although the time constant is described with respect to the effective capacitance of the MEMS, $C_{MEMS}$, one skilled in the art would understand that the same relationships described herein are applicable for other nodes coupled to an adjustable HO block.

After an overload event has occurred or is about to occur, the overload detector may reduce the new time constant $\tau_{NEW}$ by an attenuation factor N from $\tau_{OLD}$, as illustrated by the differences between curves 610 and 620. For example, $\tau_{OLD}$ may be in the order of milliseconds to seconds, and $\tau_{NEW}$ may be in the order of microseconds. By reducing the time constant, the curve 620 shows that recovery time can be reduced approximately by a factor of N.

In some examples, a first threshold may be used to determine whether an overload event is occurring or about to occur (discussed above). The first threshold may be two-thirds of the peak of the curve 610 or 620. In some examples, the first threshold may be a rate of change to the peak of the curve 610 or 620 prior to the overload event. In some examples, a second threshold may be used to determine whether an overload event has ended (also discussed above). The second threshold may be one-thirds of the peak of the curve 610 or 620. In some examples, the second threshold may be a rate of change to the bottom of the curve 610 or 620 prior to settling from the overload event.

Figure 6B:
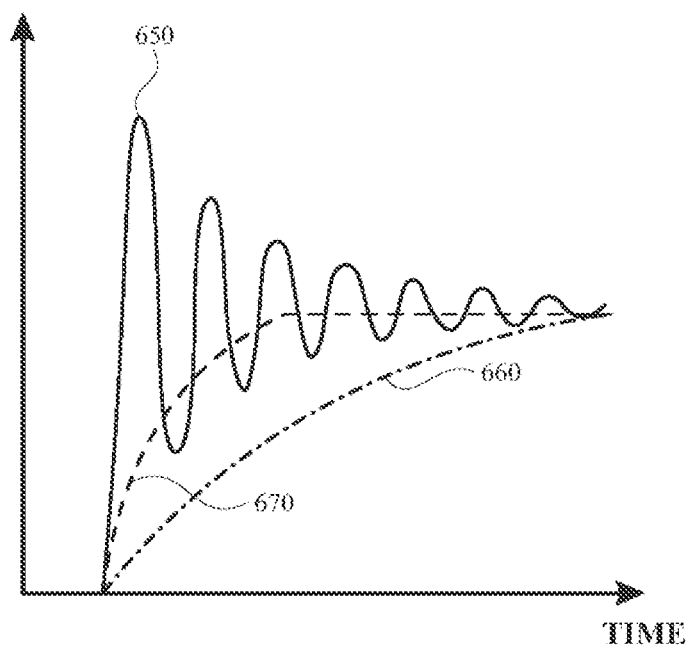
FIG. 6B illustrates a plot of curves associated with overload events in a second order system according to examples of the disclosure

Similarly, in a second order system, in accordance with a determination of an occurrence of an overload event, the HO can be configured to yield a critically damped overload event settling response (e.g., curve 670) (e.g., compared to an overdamped (e.g., curve 660) or underdamped (e.g., 650) response if an overload detector is not used to reduce the overload event settling time), as illustrated in FIG. 6B.

In some examples, the attenuation factor may be based on the properties of the HO network. In some examples, the attenuation factor may be dependent on the MEMS effective capacitance, HO block impedance, and an effective inductance of the system. As discussed above, an adjustable HO block can have a first resistance and a second resistance, where the first resistance can be greater than the second resistance. The attenuation factor N can be a ratio between an adjustable HO block's first resistance (e.g., R1+R2 in block 401 illustrated in FIG. 4A) and the HO block's second resistance (e.g., R2, when the resistor 413 is shorted by the switch 411 in block 401 illustrated in FIG. 4A). Reducing the settling time using an overload detector can help to reduce the amount of total harmonic distortion (THD), sensitivity, and common-mode drift experienced by the system.

Various functions described above can be implemented in digital electronic circuit, in computer software, firmware, or hardware. The techniques can be implemented using one or more computer program products. Programmable processors and computers can be included in or packaged as mobile devices. The processes and logic flows can be performed by one or more programmable processors and by one or more programmable logic circuit. General and special purpose computer devices and storage devices can be interconnected through communication networks.

Some implementations include electronic components, such as microprocessors, storage, and memory that can store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra-density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer," "processor," and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback, such as visual feedback, auditory feedback, or tactile feedback; and input from the user can be received in any form, including acoustic, speed, or tactile input.

Many of the above-described features and applications are implemented as software processes that are specified as a set of instructions recorded on a computer readable storage medium (also referred to as a computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a standalone program or as a module, component, or subroutine, object, or other component suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms or portions of code). A computer program can be deployed to be executed on one computer or on multiple computers that are located at one site or distributed across multiple sites and interconnected by a communication network.

One skilled in the art would understand that any specific order or hierarchy of blocks in the processes disclosed is an illustration of example approaches. Based upon design preferences, one skilled in the art would understand that the specific order or hierarchy of blocks in the processes may be rearranged, or that all illustrated blocks be performed. Some of the blocks may be performed simultaneously. For example, in some instances, multitasking and parallel processing may be advantageous. Moreover, the separation of various system components in the examples described above should not be understood as requiring such separation in all examples, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein the reference to an element in the singular is not intended to mean "one and only one" unless specifically so stated, but rather "one or more." Unless specifically stated otherwise, the term "some" refers to one or more. Headings and subheadings, if any, are used for convenience only and do not limit the subject disclosure.

The predicate words "configured to," "operable to," "capable of," and "programmed to" do not imply any particular tangible or intangible modification of a subject, but, rather, are intended to be used interchangeably. For example, a processor configured to monitor and control an operation or a component may also mean the processor being programmed to monitor and control the operation, or the processor being operable to monitor and control the operation. Likewise, a processor configured to execute code can be construed as a processor programmed to execute code or operable to execute code.

The word "example" is used herein to mean "serving as an example or illustration." Any aspect or design described herein as "example" is not necessarily to be construed as preferred or advantageous over other aspects or designs.

A circuit is disclosed. In some examples, the circuit may comprise: a microelectromechanical system (MEMS) component; an analog front end (AFE) amplifier including an input coupled to the MEMS component and an output; an overload detector coupled to at least one or more of: the input of the AFE amplifier and the output of the AFE amplifier; and a set of high-ohmic (HO) blocks comprising: a first HO block coupled to the input of the AFE amplifier and the overload detector, wherein a resistance of the first HO block is variable and is capable of being adjusted to a first resistance or a second resistance by the overload detector, wherein the second resistance is lower than the first resistance; and logic coupled to the overload detector and configured to: determine whether an overload event at the input of the AFE amplifier, the output of the AFE amplifier, or both has occurred; and in accordance with the determination that the overload event has occurred, cause the overload detector to change the resistance of the first HO block from the first resistance to the second resistance. Additionally or alternatively, in some examples, the determination of whether the overload event has occurred comprises: determine whether a signal at the input of the AFE amplifier, the output of the AFE amplifier, or both is greater than a first threshold; and in accordance with the determination that the signal is greater than the first threshold, determine that the overload event has occurred. Additionally or alternatively, in some examples, the logic is further configured to: determine whether the overload event at the input of the AFE amplifier, the output of the AFE amplifier, or both has ended; and in accordance with the determination that the overload event has ended, cause the overload detector to change the resistance of the HO block from the second resistance to the first resistance. Additionally or alternatively, in some examples, the determination of whether the overload event has ended comprises: determine whether a signal at the input of the AFE amplifier, the output of the AFE amplifier, or both is less than a second threshold; and in accordance with the determination that the signal is less than the second threshold, determine that the overload event has ended. Additionally or alternatively, in some examples, the circuit further comprises: an analog-to-digital converter (ADC) coupled to the output of the AFE amplifier, wherein the overload detector is further coupled to the output of the ADC. Additionally or alternatively, in some examples, the first HO block comprises a resistor and a switch, the resistor and the switch are coupled in parallel, the resistance of the first HO block is the first resistance when the switch is off, and the resistance of the first HO block changes to the second resistance when the switch is on. Additionally or alternatively, in some examples, the first HO block comprises a MOSFET, the resistance of the first HO block is the first resistance when the MOSFET is off, and the resistance of the first HO block changes to the second resistance when the MOSFET is on. Additionally or alternatively, in some examples, a ratio between the first resistance and the second resistance is an attenuation factor, the resistance of the first HO block multiplied by an effective capacitance of the MEMS component at the input of the AFE amplifier is an overload event settling time constant, and the overload event settling time constant is reduced by the attenuation factor when the resistance of the first HO blocked changes from the first resistance to the second resistance. Additionally or alternatively, in some examples, the AFE amplifier comprises a second input and a second output, the inputs of the AFE amplifier are differential inputs, the outputs of the AFE amplifier are differential outputs, the set of HO blocks further comprises a second HO block coupled to the second input of the AFE amplifier and the overload detector, and the overload detector is further coupled to the second input and the second output. Additionally or alternatively, in some examples, the MEMS component is one of a microphone and a vibration sensor. Additionally or alternatively, in some examples, the first resistance is indicative of an operating level of the AFE amplifier. Additionally or alternatively, in some examples, the MEMS component at the input of the AFE amplifier has an effective capacitance, the effective capacitance and the first HO block form a high-pass filter, and the effective capacitance and the first resistance set a cutoff frequency of the high-pass filter, the cutoff frequency indicative of a frequency of interest passed from the MEMS component.

A method of operating a microelectromechanical system (MEMS) circuitry is disclosed. In some examples, the method comprises: sensing, using an overload detector, a signal at one or more of: an input of an analog front end (AFE) amplifier and an output of the AFE amplifier, wherein: the input of the AFE amplifier is coupled to a MEMS component, and the overload detector is coupled to at least one or more of the input of the AFE amplifier and the output of the AFE amplifier, and determining, using the overload detector, whether an overload event at the input of the AFE amplifier, the output of the AFE amplifier, or both has occurred; and in accordance with the determination that the overload event has occurred, causing the overload detector to change a resistance of a first high-ohmic (HO) block of a set of HO blocks from a first resistance to a second resistance, wherein: the first HO block is coupled to the overload detector, the resistance of the first HO block is variable and is capable of being adjusted to the first resistance or the second resistance by the overload detector, and the second resistance is lower than the first resistance. Additionally or alternatively, in some examples, the determination of whether the overload event has occurred comprises: determining, using the overload detector, whether a signal at the input of the AFE amplifier, the output of the AFE amplifier, or both is greater than a first threshold; and in accordance with the determination that the signal is greater than the first threshold, determining that the overload event has occurred. Additionally or alternatively, in some examples, the method further comprises: determining, using the overload detector, whether the overload event at the input of the AFE amplifier, the output of the AFE amplifier, or both has ended; and in accordance with the determination that the overload event has ended, causing the overload detector to change the resistance of the HO block from the second resistance to the first resistance. Additionally or alternatively, in some examples, the determination of whether the overload event has ended comprises: determining, using the overload detector, whether a signal at the input of the AFE amplifier, the output of the AFE amplifier, or both is less than a second threshold; and in accordance with a determination that the signal is less than the second threshold, determining that the overload event has ended. Additionally or alternatively, in some examples, the first HO block comprises a resistor and a switch, the method further comprising: coupling the resistor and the switch in parallel; changing the resistance of the first HO block to the first resistance when the switch is off, and causing the overload detector to change the resistance of the first HO block to the second resistance by turning the switch on with the overload detector. Additionally or alternatively, in some examples, the first HO block comprises a MOSFET, the resistance of the first the HO block is the first resistance when the MOSFET is off, and causing the overload detector to change the resistance of the first HO block to the second resistance comprises turning the MOSFET on with the overload detector. Additionally or alternatively, in some examples, the method further comprises setting an operating level of the AFE amplifier based on the first resistance. Additionally or alternatively, in some examples, the MEMS component at the input of the AFE amplifier has an effective capacitance, the effective capacitance and the first HO block form a high-pass filter, and the effective capacitance and the first resistance set a cutoff frequency of the high-pass filter, the method further comprising: passing frequencies of interest from the MEMS component using the high-pass filter.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:
1. An apparatus comprising:
a microelectromechanical system (MEMS) component configured to generate a signal on a MEMS output;
an analog front-end (AFE) amplifier including an AFE input coupled to the MEMS output, and an AFE output;
a set of high-ohmic (HO) blocks, ones of the HO blocks configured to have selectable first or second resistances based on a state of a respective control terminal;
a high-pass filter circuit comprising:
an effective capacitance of the MEMS output; and
a first HO block of the set of HO blocks including a respective output terminal coupled to the AFE input, wherein the effective capacitance of the MEMS output and a selected resistance determine a cutoff frequency of the high-pass filter circuit; and
an overload detector, coupled to one or more of the AFE input and the AFE output, and configured to adjust the cutoff frequency of the high-pass filter circuit by changing the state of the respective control terminal to select the second resistance of the first HO block.

2. The apparatus of claim 1, wherein to adjust the cutoff frequency of the high-pass filter circuit, the overload detector is further configured to adjust the cutoff frequency in response to a determination that an overload event has occurred at the AFE input, the AFE output, or both.

3. The apparatus of claim 2, wherein the overload detector is further configured, in response to a determination that the overload event has ended, to change the state of the respective control terminal to select the first resistance of the HO block.

4. The apparatus of claim 1, wherein the overload detector is further configured to change an operating level of the AFE amplifier by changing the state of the respective control terminal to select the second resistance of the first HO block.

5. The apparatus of claim 4, wherein a second HO block of the set includes a respective output terminal coupled to a second AFE input.

6. The apparatus of claim 5, wherein to change the operating level of the AFE amplifier, the overload detector is further configured to selectively change the state of the respective control terminals of the first and second HO blocks.

7. The apparatus of claim 5, wherein the MEMS component includes a second MEMS output coupled to the second AFE input, and wherein the MEMS output and the second MEMS output collectively form a differential output.

8. The apparatus of claim 1, further comprising an analog-to-digital converter (ADC) coupled to the AFE output.

9. The apparatus of claim 1, wherein the first HO block is a metal-oxide-semiconductor field-effect transistor (MOSFET), and wherein the first resistance corresponds to the MOSFET in an off-state, and the second resistance corresponds to the MOSFET in an on-state.

10. A method, comprising:
sensing, by an overload detector, a signal at one or more of an input of an analog front-end (AFE) amplifier and an output of the AFE amplifier;
filtering, by a high-pass filter formed by an effective capacitance of an output of a microelectromechanical system (MEMS) component coupled to the input of the AFE amplifier and a first high-ohmic (HO) block coupled to the input of the AFE amplifier, portions of the signal that have a frequency below a cut-off frequency of the high-pass filter;
based on the sensing, adjusting, by the overload detector, the cut-off frequency of the high-pass filter by changing a resistance of the first HO block from a first resistance to a second resistance, wherein the second resistance is lower than the first resistance; and
changing, by the overload detector, an operating level of the AFE amplifier by selectively changing the resistance of a second HO block coupled to a second input of the AFE amplifier.

11. The method of claim 10 wherein changing the operating level of the AFE amplifier further includes changing the resistance of the first HO block from the first resistance to the second resistance.

12. The method of claim 10, further comprising independently changing, by the overload detector, the resistance of the first HO block and the resistance of the second HO block using respective first and second control signals.

13. The method of claim 1, further comprising generating, by the MEMS component a differential output that includes the output coupled to the input of the AFE amplifier and a second output coupled to the second input of the AFE amplifier.

14. The method of claim 10, wherein adjusting the cut-off frequency of the high-pass filter includes determining that an overload event has occurred at the input, the output, or both, of the AFE amplifier; and
further comprising, in response to determining that the overload event has ended, changing, by the overload detector, the resistance of the first HO block from the second resistance back to the first resistance.

15. A circuit comprising:
a microelectromechanical system (MEMS) component configured to generate a signal on a MEMS output;
an analog front-end (AFE) amplifier including an AFE input coupled to the MEMS output, and an AFE output;
a set of high-ohmic (HO) blocks, configured to have selectable first or second resistances based on a state of a respective control terminal, wherein a first HO block of the set includes an output terminal coupled to the AFE input, and a selected resistance of the first HO block multiplied by an effective capacitance at the output terminal determines a settling time constant for voltage changes at the AFE input; and an overload detector, coupled to one or more of the AFE input and the AFE output, and configured to adjust the settling time constant by changing the state of the respective control terminal to select the second resistance of the first HO block.

16. The circuit of claim 15, wherein the overload detector is further configured to change an operating level of the AFE amplifier by changing the state of the respective control terminal to select the second resistance of the first HO block.

17. The circuit of claim 15, wherein a second HO block of the set includes a respective output terminal coupled to a second AFE input.

18. The circuit of claim 17, wherein to change an operating level of the AFE amplifier, the overload detector is further configured to selectively change the state of the respective control terminals of the first and second HO blocks.

19. The circuit of claim 17, wherein the MEMS component includes a second MEMS output coupled to the second AFE input, and wherein the MEMS output and the second MEMS output collectively form a differential output.

20. The circuit of claim 15, wherein to adjust the settling time constant, the overload detector is further configured to change the state of the respective control terminal of the first HO block in response to a determination that an overload event has occurred at the AFE input, the AFE output, or both, of the AFE amplifier; and wherein the overload detector is further configured, in response to a determination that the overload event has ended, to change the state of the respective control terminal to select the first resistance of the first HO block.

* * * * *